(12) United States Patent
Park et al.

(10) Patent No.: US 9,942,979 B2
(45) Date of Patent: Apr. 10, 2018

(54) FLEXIBLE PRINTED CIRCUIT BOARD

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Kyung-wan Park, Suwon-si (KR); Shi-yun Cho, Anyang-si (KR); Hyo-young Lee, Suwon-si (KR); Hyun-jung Kim, Suwon-si (KR); Mee-ree Kim, Suwon-si (KR); Ik-joon Kim, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/930,866

(22) Filed: Nov. 3, 2015

(65) Prior Publication Data

US 2016/0128182 A1    May 5, 2016

Related U.S. Application Data

(60) Provisional application No. 62/074,240, filed on Nov. 3, 2014.

(30) Foreign Application Priority Data

Mar. 6, 2015   (KR) ........................ 10-2015-0031960

(51) Int. Cl.
*H05K 1/00* (2006.01)
*H05K 1/02* (2006.01)
(Continued)

(52) U.S. Cl.
CPC ............ *H05K 1/0283* (2013.01); *B32B 3/08* (2013.01); *B32B 7/045* (2013.01); *B32B 27/08* (2013.01);
(Continued)

(58) Field of Classification Search
CPC .. H05K 1/00; H05K 1/02; H05K 1/09; H05K 1/28; H05K 3/08; G02F 1/15; G02F 1/136; B32B 5/12; B32B 5/16
(Continued)

(56) References Cited

U.S. PATENT DOCUMENTS 6,297,063 B1 * 10/2001 Brown ............. H01L 23/49877
                                                  257/E21.705
6,743,982 B2    6/2004 Biegelsen et al.
(Continued)

FOREIGN PATENT DOCUMENTS

KR   10-2009-0079387 A   7/2009
KR   10-2012-0123358 A   11/2012

OTHER PUBLICATIONS

Feng Xu et al., "Highly Conductive and Stretchable Silver Nanowire Conductors", Advanced Materials, 2012, pp. 5117-5122; 9 pgs total (3 of which is supporting information).
(Continued)

*Primary Examiner* — Xiaoliang Chen
(74) *Attorney, Agent, or Firm* — Sughrue Mion, PLLC

(57) ABSTRACT

A flexible printed circuit board (PCB) has stretchability and durability. The flexible PCB includes: a first polymer substrate having flexibility, stretchability, or elasticity; a second polymer substrate having flexibility, stretchability, or elasticity; a conductive track disposed between the first and second polymer substrates and including metal nanowires;
(Continued)

and a cured silane coupling agent which bonds the conductive track to at least one of the first and second polymer substrates.

14 Claims, 3 Drawing Sheets

(51) Int. Cl.
    *B32B 7/04*     (2006.01)
    *B32B 27/08*     (2006.01)
    *B32B 27/28*     (2006.01)
    *B32B 27/32*     (2006.01)
    *B32B 27/34*     (2006.01)
    *B32B 27/36*     (2006.01)
    *B32B 27/40*     (2006.01)
    *B32B 3/08*     (2006.01)
    *H05K 1/09*     (2006.01)
    *H05K 3/38*     (2006.01)

(52) U.S. Cl.
    CPC .......... *B32B 27/281* (2013.01); *B32B 27/283* (2013.01); *B32B 27/32* (2013.01); *B32B 27/34* (2013.01); *B32B 27/36* (2013.01); *B32B 27/365* (2013.01); *B32B 27/40* (2013.01); *H05K 1/097* (2013.01); *H05K 3/389* (2013.01); *B32B 2250/24* (2013.01); *B32B 2255/10* (2013.01); *B32B 2255/24* (2013.01); *B32B 2262/103* (2013.01); *B32B 2270/00* (2013.01); *B32B 2307/202* (2013.01); *B32B 2307/51* (2013.01); *B32B 2307/546* (2013.01); *B32B 2457/08* (2013.01); *H05K 2201/0133* (2013.01); *H05K 2201/0145* (2013.01); *H05K 2201/0154* (2013.01); *H05K 2201/0162* (2013.01); *H05K 2201/026* (2013.01)

(58) Field of Classification Search
    USPC .................. 174/254, 250, 253, 257; 156/60; 117/68; 428/161, 164, 215, 336, 339, 428/364, 367; 349/43
    See application file for complete search history.

(56) References Cited

U.S. PATENT DOCUMENTS

| | | | |
|---|---|---|---|
| 7,521,292 B2* | 4/2009 | Rogers | B82Y 10/00 257/40 |
| 7,557,367 B2* | 7/2009 | Rogers | B82Y 10/00 257/40 |
| 8,034,001 B2 | 10/2011 | Gal | |
| 8,097,926 B2* | 1/2012 | De Graff | A61B 1/05 257/419 |
| 8,161,826 B1 | 4/2012 | Taylor | |
| 8,250,927 B2 | 8/2012 | Anand et al. | |
| 8,294,025 B2* | 10/2012 | Fonash | B82Y 20/00 136/252 |
| 8,470,701 B2* | 6/2013 | Rogers | B81B 7/0093 257/E21.09 |
| 8,514,203 B2 | 8/2013 | Staton et al. | |
| 8,552,299 B2* | 10/2013 | Rogers | H01L 21/4867 174/254 |
| 8,628,339 B2 | 1/2014 | Koga | |
| 8,666,471 B2* | 3/2014 | Rogers | A61B 5/05 600/373 |
| 8,934,965 B2* | 1/2015 | Rogers | A61B 5/0478 600/378 |
| 9,142,864 B2* | 9/2015 | Roberts | B82Y 30/00 |
| 9,150,746 B1* | 10/2015 | Li | C09D 11/52 |
| 9,515,025 B2* | 12/2016 | Rogers | H01L 23/5387 |
| 9,554,484 B2* | 1/2017 | Rogers | A61B 5/6806 |
| 9,691,873 B2* | 6/2017 | Rogers | H01L 29/66 |
| 9,765,934 B2* | 9/2017 | Rogers | F21K 9/00 |
| 2004/0106203 A1* | 6/2004 | Stasiak | G01N 27/3278 422/82.01 |
| 2005/0066883 A1* | 3/2005 | Dubrow | H01L 21/02381 117/68 |
| 2006/0008942 A1* | 1/2006 | Romano | B82Y 10/00 438/99 |
| 2006/0159916 A1* | 7/2006 | Dubrow | B01J 20/3291 428/357 |
| 2006/0188774 A1* | 8/2006 | Niu | H01M 4/8605 429/409 |
| 2007/0126037 A1* | 6/2007 | Ikeda | B82Y 10/00 257/288 |
| 2007/0190880 A1* | 8/2007 | Dubrow | B01D 39/08 442/181 |
| 2007/0212538 A1* | 9/2007 | Niu | H01B 1/04 428/367 |
| 2008/0143906 A1* | 6/2008 | Allemand | B82Y 10/00 349/43 |
| 2008/0176030 A1* | 7/2008 | Fonash | B82Y 20/00 428/119 |
| 2008/0280169 A1* | 11/2008 | Niu | H01B 1/04 429/409 |
| 2009/0143227 A1* | 6/2009 | Dubrow | B01D 39/083 502/406 |
| 2010/0039690 A1* | 2/2010 | Agrawal | G02F 1/15 359/265 |
| 2010/0112373 A1* | 5/2010 | Coffey | B32B 33/00 428/608 |
| 2010/0173070 A1* | 7/2010 | Niu | B01D 39/083 427/215 |
| 2010/0243295 A1* | 9/2010 | Allemand | B82Y 10/00 174/250 |
| 2011/0083728 A1* | 4/2011 | Street | H01L 31/035227 136/255 |
| 2011/0275005 A1* | 11/2011 | Zhu | B82Y 30/00 429/482 |
| 2011/0281070 A1* | 11/2011 | Mittal | H01L 31/022466 428/142 |
| 2011/0287318 A1* | 11/2011 | Loveness | H01M 4/0428 429/218.1 |
| 2012/0132930 A1* | 5/2012 | Young | H01L 31/0481 257/84 |
| 2013/0011736 A1* | 1/2013 | Loveness | H01M 4/0492 429/212 |
| 2013/0056244 A1* | 3/2013 | Srinivas | G06F 3/041 174/250 |
| 2013/0068286 A1* | 3/2013 | Wang | H01L 31/035227 136/249 |
| 2014/0035603 A1 | 2/2014 | Ray | |
| 2014/0085837 A1* | 3/2014 | Hong | H05K 1/092 361/751 |
| 2014/0174190 A1 | 6/2014 | Kulkarni et al. | |
| 2014/0234157 A1* | 8/2014 | Chen | H01B 1/02 420/507 |
| 2014/0242343 A1* | 8/2014 | Free | B44C 1/17 428/164 |
| 2014/0287639 A1* | 9/2014 | Lee | H01B 1/22 442/64 |
| 2015/0099062 A1* | 4/2015 | Tseng | H01M 4/926 427/115 |
| 2015/0144380 A1* | 5/2015 | Yang | H05K 1/097 174/253 |
| 2015/0378489 A1* | 12/2015 | Park | G02F 1/13439 427/553 |
| 2016/0026846 A1* | 1/2016 | Lin | G06K 9/0002 382/124 |
| 2016/0037608 A1* | 2/2016 | Ikeda | H05B 33/12 362/235 |
| 2016/0064696 A1* | 3/2016 | Collier | H01L 21/477 428/161 |
| 2016/0103539 A1* | 4/2016 | Jinbo | G06F 3/0412 345/173 |
| 2016/0111485 A1* | 4/2016 | Chida | H01L 27/322 257/40 |

(56) References Cited

U.S. PATENT DOCUMENTS

2016/0118156 A1* 4/2016 Kawaguchi ............. H01B 1/22
 252/514
2016/0122562 A1* 5/2016 Yang .................. C09D 7/1241
 428/215
2016/0205775 A1* 7/2016 Uchida ................... H01B 1/22
 174/257
2016/0218009 A1* 7/2016 Chang .................. H01L 21/288

OTHER PUBLICATIONS

Xinning Ho et al., "Biaxially stretchable silver nanowire transparent conductors", Journal of Applied Physics, http://hdl.handle.net/10220/18432, 2013, 7 pgs. total.

X.L. Wang et al., "Stretchable Conductors with Ultrahigh Tensile Strain and Stable Metallic Conductance Enabled by Prestrained Polyelectrolyte Nanoplatforms", Advanced Materials, Jul. 2011, pp. 3090-3094, 6 pgs total.

* cited by examiner

FLEXIBLE PRINTED CIRCUIT BOARD

CROSS-REFERENCE TO RELATED APPLICATIONS

This application claims the benefit of U.S. Patent Application No. 62/074,240, filed on Nov. 3, 2014, and priority from Korean Patent Application No. 10-2015-0031960, filed on Mar. 6, 2015, in the Korean Intellectual Property Office, the disclosures of which are incorporated herein by reference in their entireties.

BACKGROUND

1. Field

Apparatuses and methods consistent with exemplary embodiments relate to a printed circuit board (PCB), and more particularly, to a PCB having flexibility or stretchability.

2. Description of the Related Art

A printed circuit board (PCB) is a member that mechanically supports and electrically connects electronic components using conductive tracks, pads, and other features. A conventional PCB is etched from copper sheets laminated onto a non-conductive substrate, and thus is in a rigid form.

A flexible PCB may be used as a bendable connecting-member to connect rigid PCBs, and accordingly, the flexible PCB helps with the manufacture of small electronic products having a complicated structure.

However, some flexible PCBs may have poor workability and poor reliability in regard to a surface mounting process and a connector-bonding process.

Therefore, a combination of the rigid PCB, which has excellent workability and reliability in regard to a surface mounting process and a connector-bonding process, and the flexible PCB, which can be used as a bendable connecting-member, may be used.

A flexible PCB having further improved stretchability and durability (i.e., resistance to repeated bending stress) may be desired.

SUMMARY

Exemplary embodiments may address the above problems and/or disadvantages and other disadvantages not described above. Also, the exemplary embodiments are not required to overcome the disadvantages described above, and may not overcome any of the problems described above.

Provided is a flexible printed circuit board (PCB) having stretchability and durability. A flexible PCB may include conductive tracks or conductive pads that are not destroyed, even when a bending impact is repetitively applied thereto. In addition, a flexible PCB may include conductive tracks or conductive pads that adhere to a substrate such that they are not delaminated from the substrate, even when a bending impact is repetitively applied thereto. Accordingly, provided is a flexible PCB having conductive tracks or conductive pads which undergo a minimal change in electrical conductivity thereof, even when a bending impact is repetitively applied thereto.

According to an aspect of an exemplary embodiment, there is provided a flexible printed circuit board (PCB) including: a first polymer substrate having at least one of flexibility, stretchability, and elasticity; a second polymer substrate having at least one of flexibility, stretchability, and elasticity; a conductive track including metal nanowires disposed between the first polymer substrate and the second polymer substrate; and a cured silane coupling agent configured to bond the conductive track to at least one of the first polymer substrate and the second polymer substrate.

The first polymer substrate and the second polymer substrate may each have a thickness in a range of about 10 µm to about 3,000 µm.

The first polymer substrate and the second polymer substrate may each include at least one of a polydimethylsiloxane (PDMS)-based resin, a polyimide (PI)-based resin, a polyamide-based resin, a polyester-based resin, a polyethylene-based resin, a polypropylene-based resin, a polyurethane-based resin, and a polycarbonate-based resin.

The first polymer substrate and the second polymer substrate may include a PDMS-based resin.

The metal nanowires may have an average aspect ratio in a range of about 20 to about 300.

The metal nanowires may have an average diameter in a range of about 1 nm to about 500 nm.

The metal nanowires may have an average length in a range of about 5 µm to about 30 µm.

The metal nanowires disposed in the conductive track may have an average population density in a range of about 100 per square centimeter to about 200,000 per square centimeter.

The metal nanowires may include at least one of silver (Ag), gold (Au), copper (Cu), platinum (Pt), palladium (Pd), nickel (Ni), cobalt (Co), and an alloy thereof.

The metal nanowires may include Ag.

The cured silane coupling agent may be produced from a silane coupling agent represented by a chemical formula of $R_nSiX_{(4-n)}$, wherein X indicates a hydrolytic group and R is a non-hydrolytic organic radical.

R may include at least one of an epoxy group, a (meth) acrylate group, an isocyanate group, a vinyl group, a styryl group, an amino group, an isocyanurate group, an ureide group, a mercapto group, and a sulfide group.

The silane coupling agent may include at least one of 2-(3,4-epoxycyclohexyl)ethyltrimethoxysilane),3-glycidoxypropyltrimethoxysilane, 2-(3,4-epoxycyclohexyl) ethyltriethoxysilane, 5,6-epoxyhexyltriethoxysilane, (3-glycidoxypropyl)methyldiethoxysilane, (3-glycidoxypropyl)methyldimethoxy silane, and (3-glycidoxypropyl)dimethylethoxysilane.

The silane coupling agent may include at least one of 3-methacryloxypropyltrimethoxysilane, methacryloxypropyltrimethoxysilane, N-(3 -acryloxy-2-hydroxypropyl)-3-amino propyltriethoxysilane, O-(methacryloxyethyl)-N-(triethoxy-silylpropyl)urethane, N-(3-methacryloxy-2-hydroxypropyl)-3-aminopropyltriethoxysilane, methacryloxy methyltriethoxysilane, methacryloxymethyltrimethoxy-silane, methacryloxypropyl triethoxysilane, (3-acryloxypropyl)methyldimethoxysilane, (methacryloxymethyl)methyl-diethoxysilane, (methacryloxymethyl)methyl-dimethoxysilane, (meth)acryloxypropylmethyldiethoxysilane), methacryloxypropylmethyldi-methoxysilane, and methacryloxypropyldimethylethoxy-silane, methacryloxypropyldimethylmethoxysilane.

The silane coupling agent may include at least one of isocyanotopropyltriethoxysilane, (isocyanatomethyl)methyldimethoxysilane, 3-isocyanatopropyltrimethoxysilane, tris[3-(trimethoxysilyl)propyl]isocyanurate, (3-triethoxysilylpropyl)-t-butylcarbamate, triethoxysilylpropylethylcarbamate, and 3-thiocyanatopropyl triethoxysilane.

The silane coupling agent may include at least one of allyltrimethoxysilane, 3-(N-styryl methyl-2-aminoethylamino)-propyltrimethoxysilane, vinyltriacetoxy silane, vinyltriethoxysilane, vinyltriisopropenoxysilane, vinyltriisopropoxy silane, vinyltrimethoxysilane, 3-aminopropyltriethoxysilane, 3-aminopropyl trimethoxysilane, 4-aminobutyltriethoxysilane, m-aminophenyltrimethoxysilane, p-aminophenyltrimethoxysilane, aminophenyltrimethoxysilane, 3-aminopropyl tris(methoxyethoxy-ethoxy)silane, acetoxymethyltriethoxysilane, acetoxymethyl trimethoxysilane, acetoxypropyltrimethoxysilane, and benzoyloxypropyltrimethoxy silane.

The flexible PCB of claim 11 may include a conductive pad configured to be electrically in contact with the conductive track.

According to an aspect of another exemplary embodiment, there is provided a method of preparing a flexible printed circuit board (PCB), the method including: forming a pattern of a conductive track on a first polymer substrate, the pattern of the conductive track including metal nanowires; coating the pattern of the conductive track with a silane coupling agent-containing solution; disposing a second polymer substrate on the silane coupling agent-containing solution; and curing the silane coupling agent-containing solution.

According to an aspect of another exemplary embodiment, there is provided a printed circuit board (PCB) including: a first flexible substrate and a second flexible substrate; a conductive area disposed between the first flexible substrate and the second flexible substrate; a coupling agent configured to bond the conductive area to at least one of the first flexible substrate and the second flexible substrate, wherein the conductive area includes a plurality of metal nanowires that are configured to remain in contact each other when the PCB is bent or stretched.

The conductive area may include a conductive track adhered to at least one of the first flexible substrate and the second flexible substrate.

Additional aspects will be set forth in part in the description which follows and, in part, will be apparent from the description, or may be learned by practice of one or more exemplary embodiments.

BRIEF DESCRIPTION OF THE DRAWINGS

These and/or other aspects will become apparent and more readily appreciated from the following description of one or more exemplary embodiments, taken in conjunction with the accompanying drawings in which.

DETAILED DESCRIPTION

Figure 1:
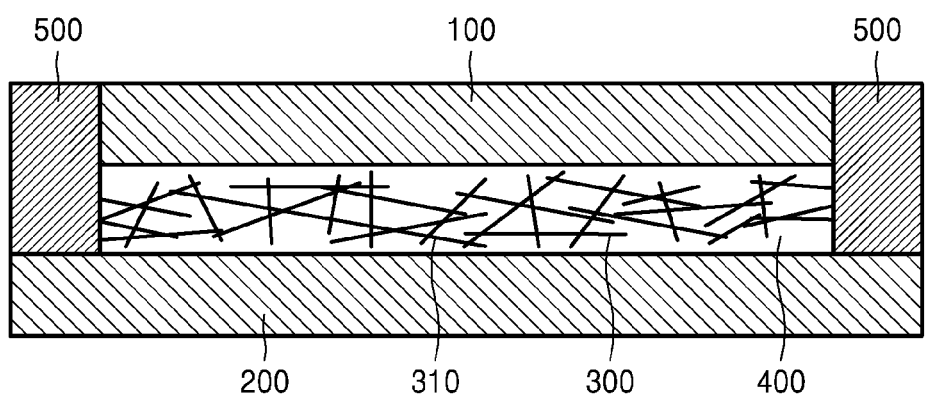
FIG. 1 is a schematic cross-sectional view illustrating a flexible printed circuit board (PCB) according to an exemplary embodiment.

Reference will now be made in detail to exemplary embodiments, examples of which are illustrated in the accompanying drawings, wherein like reference numerals refer to like elements throughout. Exemplary embodiments may have different forms and should not be construed as being limited to the descriptions set forth herein. Accordingly, one or more exemplary embodiments are described below, by referring to the figures, to explain aspects of exemplary embodiments. Expressions such as "at least one of," when preceding a list of elements, modify the entire list of elements and do not modify the individual elements of the list.

Figure 2:
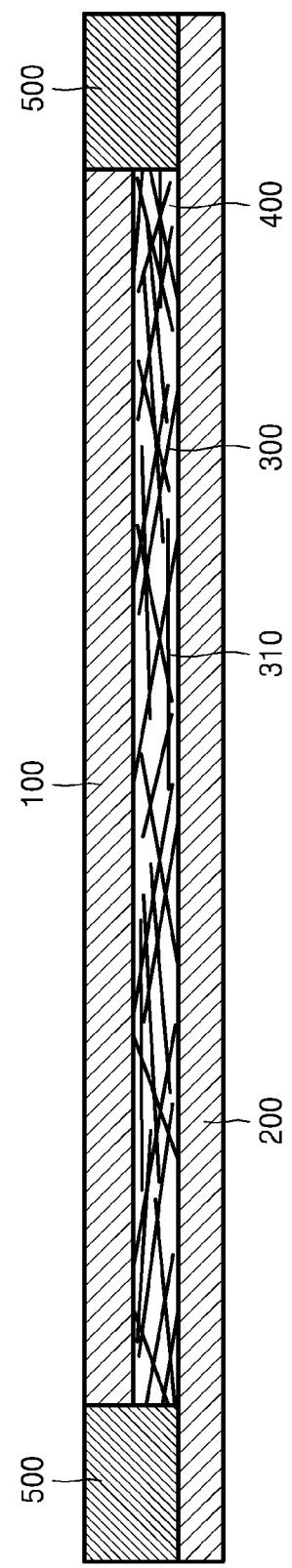
FIG. 2 is a cross-sectional view illustrating a flexible PCB when it is stretched, according to an exemplary embodiment.
Figure 3:
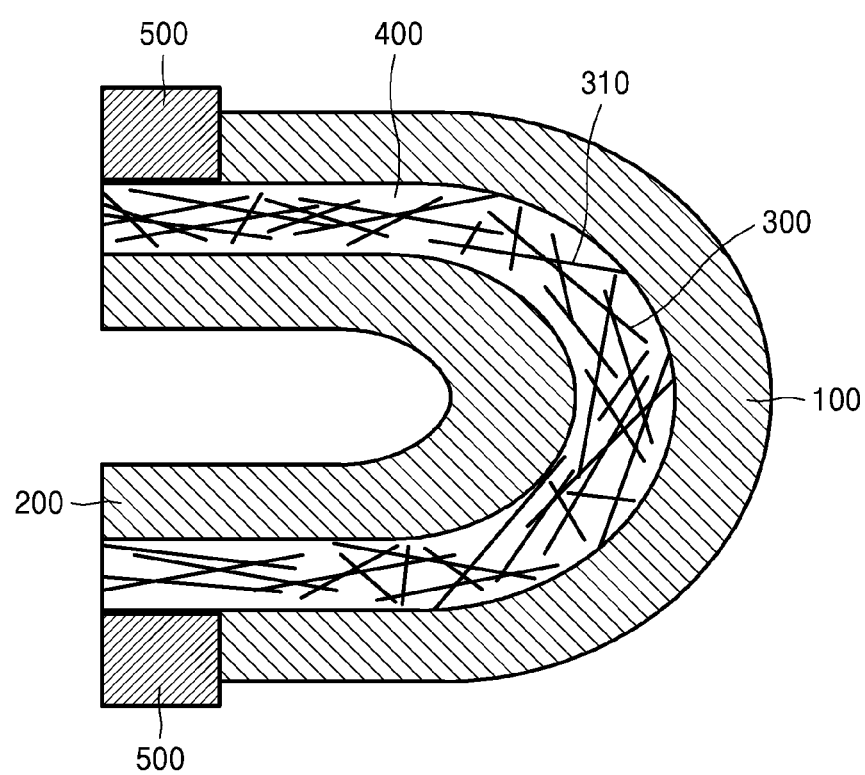
FIG. 3 is a cross-sectional view illustrating a flexible PCB when it is bent, according to an exemplary embodiment.

Below, a flexible printed circuit board (PCB) according to an exemplary embodiment will be described by referring to FIGS. 1 to 3.

According to an exemplary embodiment, illustrated in FIG. 1, a flexible PCB includes: a first polymer substrate 100 having flexibility, stretchability, or elasticity; a second polymer substrate 200 having flexibility, stretchability, or elasticity; a conductive track 300 disposed between the first polymer substrate 100 and the second polymer substrate 200, and including metal nanowires 310; and a cured silane coupling agent 400 which bonds the conductive track 300 to at least one of the first polymer substrate 100 and the second polymer substrate 200.

The first polymer substrate 100 and the second polymer substrate 200 provide the flexible PCB with flexibility, stretchability or elasticity. The first polymer substrate 100 and the second polymer substrate 200 may be, for example, in a sheet form. The first polymer substrate 100 and the second polymer substrate 200 are disposed to face each other.

The first polymer substrate 100 and the second polymer substrate 200 may each have a thickness, for example, in a range of about 10 µm to about 3,000 µm. When the thickness of each of the first polymer substrate 100 and the second polymer substrate 200 is too small, physical damages may occur due to low dimensional stability of the substrates. When the thickness of each of the first polymer substrate 100 and the second polymer substrate 200 is too large, the substrates may exhibit low bending and elongation properties.

The first polymer substrate 100 and the second polymer substrate 200 may include a polymer having flexibility, stretchability, or elasticity. For example, the first polymer substrate 100 and the second polymer substrate 200 may each be independently selected from a polydimethylsiloxane (PDMS)-based resin, a polyimide (PI)-based resin, a polyamide-based resin, a polyester-based resin, a polyethylene-based resin, a polypropylene-based resin, a polyurethane-based resin, a polycarbonate-based resin, and a combination of two or more thereof.

The first polymer substrate 100 and the second polymer substrate 200 may each independently include a PDMS-based resin. PDMS is an elastomer having viscoelastic properties, and is used in a silicon-based adhesive composition. PDMS may be, for example, adhered to a support, such as polyethylene terephthalate (PET), or glass. In addition, PDMS may exhibit excellent durability, weather resistance, and flexibility properties. PDMS may have a linear elongation-at-break of up to about 30%, and thus may provide the flexible PCB with stretchability. PDMS is chemically inert and has excellent heat resistance. In addition, PDMS may have excellent transparency.

The conductive track 300 provides the flexible PCB with an electron transfer pathway. The conductive track 300 may be disposed between the first polymer substrate 100 and the second polymer substrate 200, and accordingly, the conductive track 300 may be efficiently prevented from being delaminated off to the outside of the flexible PCB. The conductive track 300 may be formed in any pattern.

The conductive track 300 may include metal nanowires 310. For example, the conductive track 300 may be a group of a plurality of metal nanowires 310. A plurality of metal nanowires 310 are in contact with each other, thereby forming an electrically conductive network. Accordingly, the plurality of metal nanowires 310 may efficiently form the conductive track 300. In a single metal nanowire 310, abundant contact points for the contact with other adjacent metal nanowires 310 may be provided throughout the entire length of the single metal nanowire 310. Therefore, even if the flexible PCB is bent (see FIG. 3) or stretched (see FIG. 2), a number of metal nanowires 310 are still in contact with each other, thereby maintaining the electrically conductive network. In addition, the single metal nanowire 310 may provide abundant contact points for the other adjacent metal nanowires 310 along the entire length of the single metal nanowire 310. Thus, even if the flexible PCB is repeatedly bent or stretched, a plurality of metal nanowires 310 are still in contact with each other, thereby maintaining the electrically conductive network. Consequently, even when a bending impact is repetitively applied, the electrical conductivity of the conductive track 300 may only be changed a little, or may be substantially unchanged.

The metal nanowires 310 may have an average aspect ratio (i.e., a ratio of an average length of the metal nanowires 310 to an average diameter of the metal nanowires 310), for example, in a range of about 20 to about 300. When the average aspect ratio of the metal nanowires 310 is too small, the metal nanowires 310 may become rigid rather than having a wire form, and thus, may not be appropriate for bending and flexural properties. When the average aspect ratio of the metal nanowires 310 is too large, the metal nanowires 310 may have decreased dimensional stability, and thus, may not be uniform due to an entanglement phenomenon, as may occur in fiber strands.

The metal nanowires 310 may have an average diameter, for example, in a range of about 1 nm to about 500 nm. When the average diameter of the metal nanowires 310 is too small, the metal nanowires 310 may be susceptible to mechanical damages, due to reduction in strength, such as destruction or deformation. When the average diameter of the metal nanowires 310 is too large, the metal nanowires 310 may have a lowered flexibility, due to rigid properties rather than nanowire properties.

The metal nanowires 310 may have an average length, for example, in a range of about 5 μm to about 30 μm. When the average length of the metal nanowires 310 is too small, the metal nanowires 310 may result in poor electrical properties due to poor contact between the nanowires 310 when being stretched. When the average length of the metal nanowires 310 is too large, it may be difficult to form a pattern of a certain size by using the metal nanowires 310, due to reduction in coating properties.

A thickness of the conductive track 300 may be represented by a population density, i.e., an average number of the metal nanowires 310 per a unit area of the conductive track 300. The average population density of the metal nanowires 310 included in the conductive track 300 may be in a range of about 100 metal nanowires/$cm^2$ to about 200,000 metal nanowires/$cm^2$. When the average population density of the metal nanowires 310 is too small, the metal nanowires 310 may have an increased resistance, due to a reduced number of contact points between the metal nanowires 310. When the average population density of the metal nanowires 310 is too large, the metal nanowires 310 may be subjected to delamination when being stretched and bent.

The metal nanowires 310 may include, for example, silver (Ag), gold (Au), copper (Cu), platinum (Pt), palladium (Pd), nickel (Ni), cobalt (Co), an alloy thereof, or a combination thereof (i.e., a mixture of nanowires based on different metals).

The metal nanowires 310 may include Ag. Ag nanowires may have strong flexibility, significantly high transparency, and significantly high electrical conductivity. Also, Ag nanowires may have a significantly high average aspect ratio in a range of about 30 to about 200, and in this case, there may be an increase in the contact between the metal nanowires 310, leading to an increase in the electrical conductivity.

The cured silane coupling agent 400 serves to bond the metal nanowires 310 to at least one of the first polymer substrate 100 and the second polymer substrate 200. Therefore, the cured silane coupling agent 400 may be provided at an interface between the metal nanowires 310 and the first polymer substrate 100, or at an interface between the metal nanowires 310 and the second polymer substrate 200. Also, the cured silane coupling agent 400 may be provided at both an interface between the metal nanowire 310 and the first polymer substrate 100 and an interface between the metal nanowire 310 and the second polymer substrate 200. Also, the cured product of the silane coupling agent 400 may serve as a matrix in which a number of the metal nanowires 310 are dispersed. In addition, the cured product of the silane coupling agent 400 may be provided at an interface where the metal nanowire 310 is not present between the first polymer substrate 100 and the second polymer substrate 200, and therefore, the first polymer substrate 100 and the second polymer substrate 200 may be adhered to each other.

The cured silane coupling agent 400 may be efficiently bound to a PDMS-based resin. The PDMS-based resin having low surface characteristics may not be directly bonded to the metal nanowires 310. However, by using a coupling agent having a silane-based functional group, the first polymer substrate 100 or the second polymer substrate 200, each including the PDMS resin, may be effectively bonded to the metal nanowires 310.

The cured silane coupling agent 400 may be produced from, for example, a silane coupling agent represented by chemical formula of $R_nSiX_{(4-n)}$.

In the chemical formula, a functional group X is involved in the binding to the metal nanowire 310. That is, a binding between X and Si may be replaced by a binding between Si and the metal nanowire 310. X may be, for example, a hydrolytic group, such as an alkoxy group, an acyloxy group, an amine group, or a halogen atom. The number of carbon atoms included in the alkoxy group may be, for example, 1 to 4. A representative example of the alkoxy group includes methoxy or ethoxy. The number of carbon atoms included in the acyloxy group may be, for example, 1 to 4. A representative example of the acyloxy group includes an acetoxy group.

In the chemical formula, R is a non-hydrolytic organic radical. The cured silane coupling agent 400 may be bound to the first polymer substrate 100 or the second polymer substrate 200, via R. R may include, for example, an epoxy group, a (meth)acrylate group, an isocyanate group, a vinyl group, a styryl group, an amino group, an isocyanurate group, an ureide group, a mercapto group, or a sulfide group.

The silane coupling agent wherein R includes an epoxy group may be, for example, 2-(3,4-epoxycyclohexyl)ethyltrimethoxysilane, 3-glycidoxypropyltrimethoxysilane, 2-(3,4-epoxycyclohexyl)ethyltriethoxysilane, 5,6-epoxyhexyltriethoxysilane, (3-glycidoxypropyl)methyldiethoxysilane, (3-glycidoxypropyl)methyldimethoxy silane, (3-glycidoxypropyl)dimethylethoxysilane, or a combination thereof.

The silane coupling agent wherein R includes a (meth) acrylate group may be, for example, 3-methacryloxypropyltrimethoxysilane, methacryloxypropyltrimethoxysilane, N-(3-acryloxy-2-hydroxypropyl)-3-amino propyltriethoxysilane), O-(methacryloxyethyl)-N-(triethoxy-silylpropyl) urethane), N-(3-methacryloxy-2-hydroxypropyl)-3-aminopropyltriethoxysilane, methacryloxymethyltriethoxysilane, methacryloxymethyltrimethoxy-silane, methacryloxypropyltriethoxysilane, (3-acryloxypropyl)methyldimethoxysilane, (methacryloxymethyl)methyl-diethoxysilane), (methacryloxymethyl)methyl-dimethoxysilane, (meth)acryloxypropylmethyldi-ethoxysilane, methacryloxypropylmethyldimethoxysilane, methacryloxypropyldi methylethoxy-silane, methacryloxypropyldimethylmethoxy silane, or a combination thereof.

The silane coupling agent wherein R includes an isocyanurate group may be, for example, isocyanotopropyltriethoxysilane, (isocyanatomethyl)methyldimethoxysilane, 3-isocyanatopropyltrimethoxysilane, tris[3-(trimethoxysilyl)propyl]isocyanurate, (3-triethoxysilylpropyl)-t-butylcarbamate, triethoxysilylpropylethylcarbamate, 3-thiocyanatopropyl triethoxysilane, or a combination thereof.

The silane coupling agent wherein R includes vinyl and olefin groups may be, for example, allyltrimethoxysilane, 3-(N-styryl methyl-2-aminoethylamino)-propyltrimethoxysilane, vinyltriacetoxy silane, vinyltriethoxysilane, vinyltriisopropenoxysilane, vinyltriisopropoxy silane, vinyltrimethoxysilane, or a combination thereof.

The silane coupling agent wherein R includes an amino group may be, for example, 3-aminopropyltriethoxysilane, 3-aminopropyl trimethoxysilane, 4-aminobutyltriethoxysilane, m-aminophenyltrimethoxysilane, p-aminophenyltrimethoxysilane, aminophenyltrimethoxysilane, 3-aminopropyltris(methoxyethoxy-ethoxy)silane, or a combination thereof.

The silane coupling agent wherein R includes an ester group may be, for example, acetoxymethyltriethoxysilane, acetoxymethyl trimethoxysilane, acetoxypropyltrimethoxysilane, benzoyloxypropyltrimethoxy silane, or a combination thereof.

When the silane coupling agent is hydrolyzed, the substituent X in the chemical formula may be replaced by a silanol group. The silanol group of one molecule may be condensed with a silanol group of another molecule, thereby forming a siloxane linkage. Accordingly, the silane coupling agent may be cured. Alternatively, the substituent R (e.g., an epoxy group, a (meth)acrylate group, or an isocyanate group) of one molecule may be condensed or polymerized with a substituent of R (e.g., an epoxy group, a (meth) acrylate group, or an isocyanate group) of another molecule, thereby curing the silane coupling agent.

When the silane coupling agent including an isocyanate group is cured in the presence of polyol, polyurethane resin having high elasticity may be produced. In this case, the cured silane coupling agent 400 may also have high elasticity, and accordingly, the flexible PCB may also have further improved elasticity.

The flexible PCB of FIG. 1 may further include conductive pads 500, and the conductive pads 500 may each serve as a contact terminal. In addition, the conductive pads 500 may provide a soldering point for a semiconductor device. FIG. 1 illustrates an exemplary embodiment of the flexible PCB in which the conductive pads 500 are disposed on both ends of the conductive track 300. In another exemplary embodiment, the conductive pads 500 may be disposed in any position of the conductive track 300. The conductive pads 500 may be formed of any electrically conductive material, and, for example, may be formed of Ag, Au, Cu, Pt, Pd, Ni, Co, or a combination thereof.

Below, a method of preparing the flexible PCB according to another aspect of an exemplary embodiment will be described in detail.

According to an exemplary embodiment, a method of preparing the flexible PCB includes:
forming a pattern of a conductive track including metal nanowires on a first polymer substrate;
applying a silane coupling agent-containing solution to the pattern of the conductive track;
disposing a second polymer substrate on the silane coupling agent-containing solution; and
curing the silane coupling agent-containing solution.

The forming of the pattern of the conductive tracks 300 including the metal nanowire 310 on the first polymer substrate 100 may be performed by, for example, coating the first polymer substrate 100 with a metal nanowire colloid solution using a coating methods, such as painting, spraying, or printing, to form a pattern on the first polymer substrate 100. A population density of the metal nanowire 310 included in the conductive track 300 may be adjusted by, for example, adjusting an amount of the metal nanowire 310 contained in the metal nanowire colloid solution, or adjusting the number of repeating the forming of the pattern of the conductive tracks 300 including the metal nanowire 310.

The metal nanowire colloid solution may include a dispersion medium, such as water, an organic solvent (e.g., ethanol, propanol, butanol, or acetone), or a combination thereof. The metal nanowire 310 may be contained in the metal nanowire colloid solution in an amount, for example, ranging from about 0.01 weight % to about 30 weight %.

The coating of the pattern of the conductive tracks 300 with the silane coupling agent-containing solution may be performed by, for example, coating the first polymer substrate 100 with the silane coupling agent-containing solution using coating methods, such as painting, spraying, or printing. In addition, the silane coupling agent-containing solution may also be applied to other parts of the first polymer substrate 100 where the pattern of the conductive track 300 is not present.

The silane coupling agent-containing solution may be, for example, a mixture comprising water, an alcohol, and the silane coupling agent.

Water may be contained in the silane coupling agent-containing solution in an amount, for example, ranging from about 0.01 parts to about 30 parts by weight based on 100 parts by weight of the silane coupling agent.

Examples of an alcohol include ethanol, propanol, butanol, or a combination thereof. Alcohol may be contained in the silane coupling agent-containing solution in an amount, for example, ranging from about 20 parts to about 90 parts by weight based on 100 parts by weight of the silane coupling agent.

The silane coupling agent-containing solution may further include at least one of a photoinitiator and a thermal-curing agent. Examples of the photoinitiator include Irgacure 184, Irgacure 369, Irgacure 184, Irgacure 651, triphenylsulfonium triflate, triarylsulfonium hexafluorophosphate salts, tris(4-tertbutylphenyl)sulfonium triflate, or a combination thereof. Examples of the thermal-curing agent include diethylamino propyl amine, menthane diamine, N-aminoethyl piperazine, M-xylene diamine, isophorone diamine, or a combination thereof.

The silane coupling agent-containing solution may further include a polyol. In this case, when an isocyanate-based silane coupling agent is used in the presence of polyol, a reaction may occur between the isocyanate-based silane coupling agent and polyol, thereby obtaining a polyurethane-based, cured silane coupling agent. Polyol may include, for example, poly(ethylene oxide), poly(tetramethylene oxide), poly(propylene oxide), polyisobutylene oxide, poly(ethylene adipate), polycaprolactone, or a combination thereof.

The curing of the silane coupling agent-containing solution may be performed by, for example, condensing or polymerizing the silane coupling agent by applying heat or ultraviolet light thereto. Here, a temperature at which the curing is performed may be, for example, in a range of about 25° C. to about 110° C. By curing the silane coupling agent-containing solution, a cured silane coupling agent is produced. Then, the cured silane coupling agent may be used to bond the pattern of the conductive track 300 including the metal nanowires 310 to the first polymer substrate 100 or the second polymer substrate 200 in an efficient manner.

According to one or more exemplary embodiments, a flexible printed circuit board (PCB) has improved stretchability and durability. Provided is a flexible PCB of which conductive tracks or conductive pads are not destroyed, even when a bending impact is repetitively applied thereto. In addition, provided is the flexible PCB of which conductive tracks or conductive pads having significantly improved adhesive strength to a substrate are not delaminated from the substrate, even when a bending impact is repetitively applied thereto. Accordingly, provided is the flexible PCB of which conductive tracks or conductive pads have little change in electrical conductivity thereof, even when a bending impact is repetitively applied thereto.

It should be understood that exemplary embodiments described herein should be considered in a descriptive sense only and not for purposes of limitation. Descriptions of features or aspects within an exemplary embodiment should be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A flexible printed circuit board (PCB) comprising:
   a first polymer substrate having at least one of flexibility, stretchability, and elasticity;
   a second polymer substrate having at least one of flexibility, stretchability, and elasticity;
   a conductive track comprising metal nanowires disposed between the first polymer substrate and the second polymer substrate; and
   a cured silane coupling agent configured to bond the conductive track to at least one of the first polymer substrate and the second polymer substrate,
   wherein the metal nanowires comprise at least one of silver (Ag), gold (Au), copper (Cu), platinum (Pt), palladium (Pd), nickel (Ni), cobalt (Co), and an alloy thereof, and
   wherein the metal nanowires are in contact with each other, thereby maintaining an electrically conductive network along an entirety of the conductive track, and
   wherein the first polymer substrate and the second polymer substrate each comprise at least one of a polyamide-based resin, polyester-based resin, a polyethylene-based resin, a polypropylene-based resin, and a polycarbonate-based resin.

2. The flexible PCB of claim 1, wherein the first polymer substrate and the second polymer substrate each have a thickness in a range of about 10 μm to about 3,000 μm.

3. The flexible PCB of claim 1, wherein the metal nanowires have an average aspect ratio in a range of about 20 to about 300.

4. The flexible PCB of claim 1, wherein the metal nanowires have an average diameter in a range of about 1 nm to about 500 nm.

5. The flexible PCB of claim 1, wherein the metal nanowires have an average length in a range of about 5 μm to about 30 μm.

6. The flexible PCB of claim 1, wherein the metal nanowires disposed in the conductive track have an average population density in a range of about 100 per square centimeter to about 200,000 per square centimeter.

7. The flexible PCB of claim 1, wherein the metal nanowires comprise Ag.

8. The flexible PCB of claim 1, wherein the cured silane coupling agent is produced from a silane coupling agent represented by a chemical formula of $R_nSiX_{(4-n)}$, wherein X indicates a hydrolytic group and R is a non-hydrolytic organic radical.

9. The flexible PCB of claim 8, wherein R comprises at least one of an epoxy group, a (meth)acrylate group, an isocyanate group, a vinyl group, a styryl group, an amino group, an isocyanurate group, an ureide group, a mercapto group, and a sulfide group.

10. The flexible PCB of claim 8, wherein the silane coupling agent comprises at least one of 2-(3,4-epoxycyclohexyl)ethyltrimethoxysilane), 3-glycidoxypropyltrimethoxysilane, 2-(3,4-epoxycyclohexyl) ethyltriethoxysilane, 5,6-epoxyhexyltriethoxysilane, (3-glycidoxypropyl) methyldiethoxysilane, (3-glycidoxypropyl) methyldimethoxy silane, and (3-glycidoxypropyl) dimethylethoxysilane.

11. The flexible PCB of claim 8, wherein the silane coupling agent comprises at least one of 3-methacryloxypropyltrimethoxysilane, methacryloxypropyltrimethoxysilane, N-(3-acryloxy-2-hydroxypropyl)-3-amino propyltriethoxysilane, O-(methacryloxyethyl)-N-(triethoxysilylpropyl)urethane, N-(3-methacryloxy-2-hydroxypropyl)-3-aminopropyltriethoxysilane, methacryloxy methyltriethoxysilane, methacryloxymethyltrimethoxy-silane, methacryloxypropyl triethoxysilane, (3-acryloxypropyl)methyldimethoxysilane, (methacryloxymethyl) methyl-diethoxysilane, (methacryloxymethyl) methyl-dimethoxysilane, (meth)acryloxypropylmethyldiethoxysilane), methacryloxypropylmethyldi-methoxysilane, and methacryloxypropyldimethylethoxy-silane, methacryloxypropyldimethylmethoxy silane.

12. The flexible PCB of claim 8, wherein the silane coupling agent comprises at least one of isocyanotopropyltriethoxysilane, (isocyanatomethyl)methyldimethoxysilane, 3-isocyanatopropyltrimethoxysilane, tris[3-(trimethoxysilyl)propyl] isocyanurate, (3-triethoxysilylpropyl)-t-butylcarbamate, triethoxysilylpropylethylcarbamate, and 3-thiocyanatopropyl triethoxysilane.

13. The flexible PCB of claim 8, wherein the silane coupling agent comprises at least one of allyltrimethoxysilane, 3-(N-styryl methyl-2-aminoethylamino)-propyltrimethoxysilane, vinyltriacetoxy silane, vinyltriethoxysilane, vinyltriisopropenoxysilane, vinyltriisopropoxy silane, vinyltrimethoxysilane, 3-aminopropyltriethoxysilane, 3-aminopropyl trimethoxysilane, 4-aminobutyltriethoxysilane, m-aminophenyltrimethoxysilane, p-aminophenyltrimethoxysilane, aminophenyltrimethoxysilane, 3-aminopropyl tris(methoxyethoxy- ethoxy)silane, acetoxymethyltriethoxysilane, acetoxymethyl trimethoxysilane, acetoxypropyltrimethoxysilane, and benzoyloxypropyltrimethoxy silane.

14. The flexible PCB of claim 8, further comprising a conductive pad configured to be electrically in contact with the conductive track.

* * * * *